US009515106B2

United States Patent
Taghibakhsh

(10) Patent No.: US 9,515,106 B2
(45) Date of Patent: Dec. 6, 2016

(54) RADIATION IMAGING DEVICE WITH METAL-INSULATOR-SEMICONDUCTOR PHOTODETECTOR AND THIN FILM TRANSISTOR

(71) Applicant: PERKINELMER HOLDINGS, INC., Waltham, MA (US)

(72) Inventor: Farhad Taghibakhsh, Cupertino, CA (US)

(73) Assignee: PerkinElmer Holdings, Inc., Waltham, MA (US)

( * ) Notice: Subject to any disclaimer, the term of this patent is extended or adjusted under 35 U.S.C. 154(b) by 0 days.

(21) Appl. No.: 14/537,711

(22) Filed: Nov. 10, 2014

(65) Prior Publication Data

US 2016/0049431 A1 Feb. 18, 2016

Related U.S. Application Data

(60) Provisional application No. 62/038,089, filed on Aug. 15, 2014.

(51) Int. Cl.
  *H01L 27/146* (2006.01)
  *G01T 1/20* (2006.01)
  *H01L 27/12* (2006.01)

(52) U.S. Cl.
  CPC ....... *H01L 27/14612* (2013.01); *G01T 1/2006* (2013.01); *G01T 1/2018* (2013.01); *H01L 27/12* (2013.01); *H01L 27/14638* (2013.01); *H01L 27/14663* (2013.01); *H01L 27/14689* (2013.01); *H01L 27/14692* (2013.01)

(58) Field of Classification Search
  CPC combination set(s) only.
  See application file for complete search history.

(56) References Cited

U.S. PATENT DOCUMENTS

| 6,682,960 B1 | 1/2004 | Mochizuki |
| 7,012,260 B2 | 3/2006 | Endo |
| 7,208,810 B2 | 4/2007 | Wright |

(Continued)

FOREIGN PATENT DOCUMENTS

| EP | 1353382 A2 | 10/2003 |
| JP | 2004015002 A | 1/2004 |
| WO | 2014015592 A1 | 1/2014 |

OTHER PUBLICATIONS

International Search Report and Written Opinion received for PCT Application No. PCT/US2015/044625, mailed on Oct. 21, 2015, 11 pages.

*Primary Examiner* — Mohammad Islam
*Assistant Examiner* — Ratisha Mehta
(74) *Attorney, Agent, or Firm* — Morrison & Foerster LLP

(57) ABSTRACT

A photosensor pixel includes a thin film transistor (TFT) and a metal-insulator-semiconductor (MIS) photodetector. The TFT includes a gate, a gate insulator layer, a semiconductor layer forming a channel region, a drain, and a source. The MIS photodetector includes a transparent conductor layer, a semiconductor layer including a photosensitive semiconductor, and an insulator layer between the transparent conductor layer and the semiconductor layer. The semiconductor layer of the MIS photodetector is connected to the source or the drain of the TFT, and the thickness of the insulator layer of the MIS photodetector is less than the thickness of the gate insulator layer of the TFT.

6 Claims, 7 Drawing Sheets

(56) References Cited

U.S. PATENT DOCUMENTS

| | | | |
|---|---|---|---|
| 2006/0001120 A1* | 1/2006 | Wright | H01L 27/1463 257/452 |
| 2010/0320391 A1* | 12/2010 | Antonuk | H01L 27/1462 250/366 |
| 2015/0221688 A1 | 8/2015 | Xu et al. | |

* cited by examiner

RADIATION IMAGING DEVICE WITH METAL-INSULATOR-SEMICONDUCTOR PHOTODETECTOR AND THIN FILM TRANSISTOR

CROSS REFERENCE TO RELATED APPLICATION

This application claims the benefit under 35 U.S.C. 119(e) of U.S. Provisional Patent Application No. 62/038,089, filed Aug. 15, 2014, which is hereby incorporated by reference in the present disclosure in its entirety.

BACKGROUND

1. Field

This application relates generally to radiation imaging devices, and, more specifically, to photosensor pixel architectures with metal-insulator-semiconductor (MIS) photodetectors and thin film transistor (TFT) readout switches.

2. Description of the Related Art

A photosensor pixel consists of a detector and an electronic readout circuit. The photosensor pixel is operated via connection to peripheral circuits (e.g., biasing, addressing, readout and digitizer circuitries). Individual photosensor pixels can be arranged in a matrix to form an array. In imaging applications, the signal from each photosensor pixel in the array can be read and arranged (i.e., multiplexed) to generate a digital electronic image.

In existing devices, the detector portion of the photosensor pixel may be a photodetector, such as a PIN photodiode, comprising a photosensitive semiconductor material. A radiation detector, e.g., an X-ray detector, often comprises a photodetector, e.g., a PIN photodiode, optically coupled to a scintillator material. The scintillator material converts high energy radiation, such as X-rays, to lower energy photons that are suitable for detection by the photodetector, such as ultraviolet, visible, or infrared photons. The readout circuit may include a thin film transistor (TFT) switch connected to the detector that is turned off while photons are collected by the detector and turned on to read out the resulting signal.

In current medical X-ray imaging applications in particular, both the detectors and TFTs in the photosensor pixels are typically made using amorphous silicon (a-Si). The existing technology for a-Si-based large area medical imagers includes flat panels in which the photodetectors and readout TFT switches are fabricated on a glass or other type of substrate. Typically, when PIN photodiodes are used for the photodetectors, an array of TFT switches is made first, and then an array of PIN photodiodes is made on top of the TFT array.

It is desirable to fabricate the photosensor and the TFT switches in the same process to shorten the fabrication process. However, the layer structure of the photosensor is often different than the layer structure of the TFT. For example, a PIN photodetector requires two types of doped barrier layers, P and N, while TFTs have only one type of doped layer, N. Thus, the PIN and TFT cannot be formed simultaneously by the same process, which complicates fabrication.

Attempts at using types of detectors other than PIN photodiodes have been made. For example, use of a metal-insulator-semiconductor (MIS) photodetector connected to a readout TFT switch has been previously described in U.S. Pat. Nos. 6,682,960, 7,012,260, and 7,208,810. There are, however, at least two shortcomings with previous MIS designs: 1) the output signal of the photosensor pixels is represented by an induced charge at the metal layer of the MIS photodetector, while maximum absorption of incident photons occurs away from the portion of the MIS photodetector where charge storage is most efficient (i.e., the interface between the insulator and the semiconductor layers); and 2) a single layer in the fabrication process serves as both the gate insulating layer of the TFT and the insulator layer of the MIS photodetector, making both insulator layer thicknesses the same.

Thus, there remains an opportunity to improve the performance and fabrication process for MIS photodetector-based photosensor pixels.

SUMMARY

The present disclosure describes structures, operational principles, methods of operation, and fabrication processes for a novel TFT-MIS photodetector pixel and pixel array with extended sensitivity and dynamic range for large area digital optical and radiation imaging applications.

In one embodiment, a photosensor pixel includes a TFT and an MIS photodetector. The TFT includes a gate, a gate insulator layer, a semiconductor layer forming a channel region, a drain, and a source. The MIS photodetector includes a transparent conductor layer, a semiconductor layer including a photosensitive semiconductor, and an insulator layer between the transparent conductor layer and the semiconductor layer. The semiconductor layer of the MIS photodetector is connected to the source or the drain of the TFT, and the thickness of the insulator layer of the MIS photodetector is less than the thickness of the gate insulator layer of the TFT. In one embodiment, the TFT and the MIS photodetector are on a substrate, and the semiconductor layer of the MIS photodetector is between the substrate and the insulator layer of the MIS photodetector. Optionally, the semiconductor layer of the TFT is between the substrate and the gate insulator layer of the TFT. In one embodiment, the semiconductor layer of the TFT and the semiconductor layer of the MIS comprise a-Si, poly silicon, or amorphous indium gallium zinc oxide alloy.

In one embodiment, a photo-imaging device includes a plurality of photosensor pixels as described above. In one embodiment, a radiation imaging device includes the photo-imaging device and a scintillation material. The scintillation material is optically coupled to the photo-imaging device and configured to convert incident radiation to photons such that the energy of the radiation is greater than the energy of the photons.

In one embodiment, a method of fabricating a photosensor pixel includes forming a first conductive layer on a substrate and patterning the first conductive layer to form a drain electrode of a TFT, a source electrode of the TFT, and a contact layer that connects the TFT and an MIS photodetector. A semiconductor layer is formed on the first conductive layer and is patterned to form a channel region of the TFT and a photosensitive layer of the MIS photodetector. A dielectric layer is formed on the semiconductor layer and is patterned to form a first insulator layer of the MIS photodetector. A transparent conductor layer is formed on the dielectric layer and is patterned over the MIS photodetector. The dielectric layer and semiconductor layer are patterned to form a TFT semiconductor island and an MIS semiconductor island. A second insulator layer is formed and then patterned to open contact vias to the transparent conductor layer of the MIS and to the drain electrode of the TFT. A second conductive layer is formed on the second insulator layer and patterned to form the gate of the TFT and electrical contacts to the transparent conductor layer of the MIS and the drain electrode of the TFT.

In one embodiment, a method of operating an array of photosensor pixels for detecting photons is performed. Each photosensor pixel has a TFT readout switch and an MIS photodetector in which a transparent conductor layer of the MIS photodetector is connected to a voltage source, and a source electrode of the TFT is connected to a photosensitive semiconductor layer of the MIS photodetector. The method includes (a) refreshing a photosensor pixel by turning on the TFT and forward biasing the MIS by applying a positive voltage to the transparent conductor layer of the MIS photodetector to remove holes from the semiconductor layer of the MIS photodetector; (b) resetting the photosensor pixel by keeping the TFT on and reverse biasing the MIS by applying a negative voltage to the transparent layer of the MIS photodetector to remove electrons from the semiconductor layer of the MIS photodetector; (c) setting the photosensor pixel to an integration mode to integrate photons absorbed in the semiconductor layer of the MIS photodetector by turning off the TFT and keeping the MIS photodetector reverse biased by applying a negative voltage to the transparent conductor layer of the MIS photodetector such that electrons are collected at the source electrode of the TFT when photons are absorbed in the semiconductor layer of the MIS photodetector; and (d) reading a signal value of the photosensor pixel by turning on the TFT and applying a negative voltage to the transparent conductor layer of the MIS photodetector to readout the charge collected at the source electrode of the TFT. If the photosensor pixel is not saturated, steps (c) and (d) are repeated without performing steps (a) and (b). Otherwise, the method starts over from step (a).

The embodiments depicted in the figures are only exemplary. One skilled in the art will readily recognize from the following discussion that alternative embodiments of the structures and methods illustrated herein can be employed without departing from the principles described herein.

DETAILED DESCRIPTION

The following description sets forth specific configurations, parameters, and the like. It should be recognized, however, that such description is not intended as limiting the present disclosure, but is instead provided as a description of exemplary embodiments.

The present disclosure provides an improved photosensor pixel architecture that includes an MIS photodetector and a TFT readout switch. The architecture is based on different materials and uses a different configuration of layers compared to prior art devices having MIS photodetectors. The architecture results in improved dynamic range and sensitivity, which are essential for high performance digital imagers. In particular, the architecture provides for direct readout of the charge produced in the photosensitive semiconductor layer and maximum absorption of incident radiation at the interface between the insulator and semiconductor layers, where charge generation and storage are most efficient.

The architecture also allows for fabrication of the two fundamental elements of the photosensor pixel, i.e., the MIS photodetector and the TFT readout switch, on the same substrate during the same process steps. The same material layers are formed on the TFT and MIS photodetector regions of the substrate in the same order, but are etched differently to create different structures. The architecture also allows the TFT and the MIS photodetector to have different insulator thicknesses, allowing each to be optimized individually. In addition to improved performance, the architecture may result in substantial savings in energy usage, production time, and materials used. The fabrication process also requires fewer steps, which may allow for less accumulated overall defects and improved yield.

Figure 1:
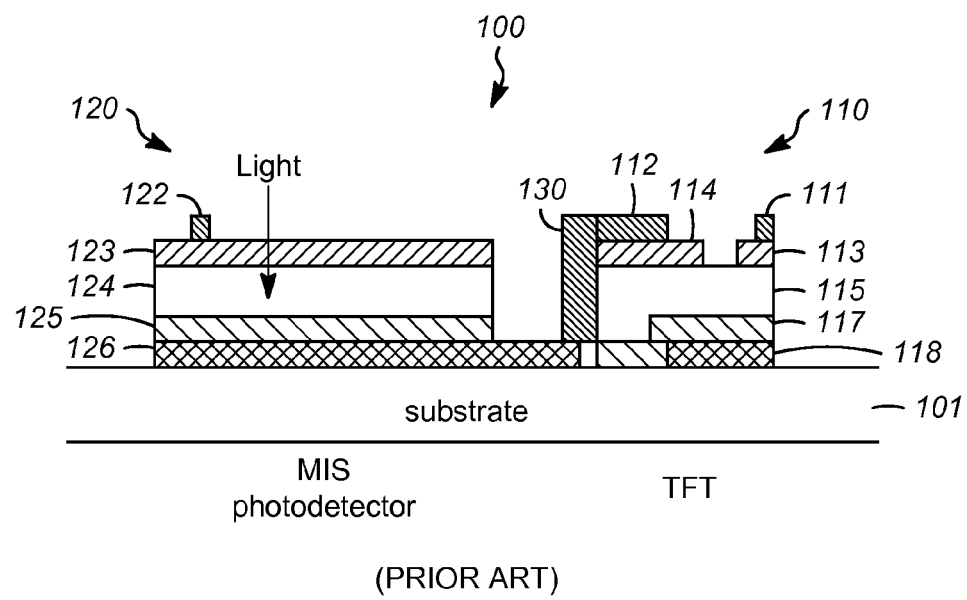
FIG. 1 depicts a diagram of a prior art photosensor pixel having an MIS photodetector and a TFT readout switch.

FIG. 1 depicts a photosensor pixel 100, which includes an MIS photodetector 120 connected to a TFT readout switch 110. As seen in FIG. 1, a lower metal layer is formed on a substrate. The lower metal layer acts as a gate electrode 118 of the TFT and a lower electrode 126 of the MIS photodetector (i.e., the metal layer of the MIS photodetector). An insulator layer is formed on the lower metal layer. The insulating layer acts as a gate insulating film 117 of the TFT and as the insulator layer 125 of the MIS photodetector. An intrinsic semiconductor layer is formed on the insulator layer. The semiconductor layer acts as a photoelectric conversion layer 125 of the photodetector and a semiconductor layer 115 of the TFT. A film of heavily doped n-type semiconductor (n+) is formed on the intrinsic semiconductor layer. The n+ film acts as a carrier barrier layer 123 of the MIS photodetector and an ohmic contact layer, 113, 114 of the TFT. Finally, an upper metal layer is placed on the n+ layer and serves as an upper electrode 122 of the MIS photodetector and provides the drain and source electrodes 111, 112 of the TFT. The upper metal layer also provides a connection 130 between the two pixel elements by connecting the lower electrode 126 of the MIS photodetector to the source electrode 112 of the TFT.

When light is incident on the MIS photodetector 120, electron-hole pairs are created in the semiconductor layer 124. To detect the amount of radiation incident on the MIS photodetector 120, the photosensor pixel 100 is operated in an integration mode in which the upper electrode 122 is given a positive potential relative to the lower electrode 126. During integration, electrons in the semiconductor layer 124 are drawn to the upper electrode 122 and holes are pushed to the interface between the semiconductor layer 124 and the insulating layer 125. Since holes cannot move into the insulating layer 125, a positive charge accumulates on the lower electrode 126 to keep the MIS photodetector 120 electrically neutral.

Essentially, the MIS photodetector 120 acts as a photosensitive capacitor that accumulates opposite charges on each side of the detector in response to photons incident on the semiconductor layer 124. The induced charge on the lower electrode 126 is proportional to the amount of electron-hole pairs generated in the semiconductor layer 124, and is therefore proportional to the amount of incident radiation. Accordingly, the induced charge on the lower electrode 126 produced as a result of the absorption of the incident photons constitutes the signal value of the photosensor pixel 100. The signal value is read out by turning on the TFT switch 110.

There are various disadvantages to the configuration of photosensor pixel 100. For example, photons enter the semiconductor layer 124 on the n+ layer-side of the MIS photodetector 120. Maximum absorption occurs where the photons first strikes the semiconductor layer 124, so a greater amount of photons are absorbed away from the insulator/semiconductor interface where holes are collected. As a result, the majority of electron-hole pairs are created away from where the established electric field in the device can effectively separate electrons from holes, and where holes eventually accumulate, forcing the holes to travel through a large portion of the semiconductor layer 124. This is inefficient and reduces the sensitivity of photosensor pixel 100.

Furthermore, in photosensor pixel 100, the MIS photodetector 120 and the TFT 110 share the same insulating layer. As a result, the TFT gate insulating film 117 and the MIS insulator layer 125 have the same thickness. The thickness of the TFT gate insulating film 117 and the MIS insulator layer 125 affect the performance of the TFT 110 and the MIS photodetector 120, respectively. In general, the insulator thickness that optimizes the performance of the TFT 110 is not the same as the thickness that optimizes the MIS photodetector 120. This configuration requires a trade-off between the optimum gate insulator thicknesses of the TFT and MIS, reducing dynamic range and sensitivity of the pixel.

Figure 2:
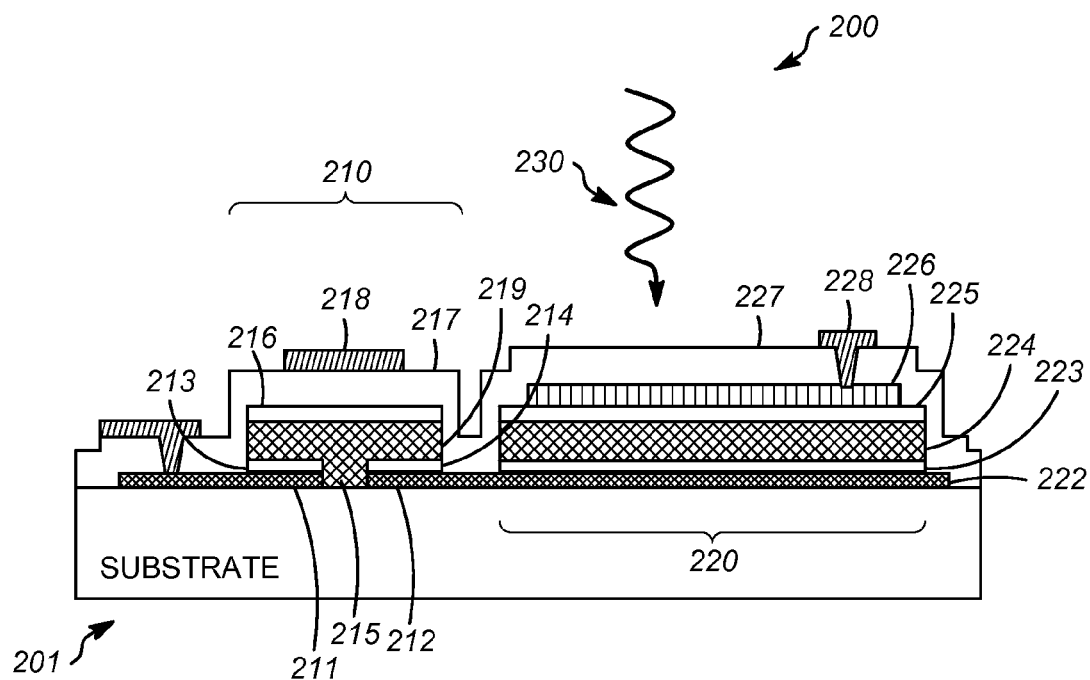
FIG. 2 depicts a diagram of an embodiment of an improved photosensor pixel having an MIS photodetector and a TFT readout switch.

FIG. 2 depicts an exemplary embodiment of an improved photosensor pixel 200 with a TFT readout switch 210 and MIS photodetector 220 formed on a common substrate 201.

The TFT 210 includes drain electrode 211, source electrode 212, gate electrode 218, and channel region 215. The drain electrode 211 and source electrode 212 are on a substrate 201. There is a heavily doped n-type semiconductor (n+) layer 213, 214 on each of the drain electrode 211 and source electrode 212. The n+ layers 213, 214 act as ohmic contact layers. The drain and source electrodes 211, 212 may include a conductive material such as, for example, a metal, Mo, Ti, indium tin oxide (ITO), indium zinc oxide (IZO), Al, Au, or the like. The n+ layers 213, 214 may include a material such as, for example, a-Si, or the like.

On the n+ layers 213, 214 of the TFT 210 is a semiconductor layer 219. In the TFT 210, the semiconductor layer 219 is between the source electrode 212 and drain electrode 211 to create the channel region 215. The semiconductor layer 219 includes a material that produces electron-hole pairs in response to incident photons (i.e., a photosensitive semiconductor) such as, for example, a-Si, metal oxide semiconductors, or the like. As discussed in greater detail below, using a photosensitive semiconductor material allows the TFT readout switch 210 and the MIS photodetector 220 to be formed at the same time since the semiconductor layer 219 can be used for both the photosensitive layer of the MIS photodetector and the semiconductor material for the TFT readout switches.

In TFT 210, a thin dielectric layer 216 covers the semiconductor layer 219 and a thicker insulator layer 217 is on the thin dielectric layer 216. These two insulator layers serve as the gate insulator of the TFT. The dielectric layers 216 and 217 may include, for example, a-Si nitride, silicon nitride, or the like.

The gate electrode 218 of TFT 210 is on top of the gate insulator layer 217. The gate electrode 218, which also serves as a light block to block light 230 and prevent photons from reaching the channel 215 of the TFT 210, may include a conductive material such as, for example, a metal, Mo, Ti, Al, Au, or the like.

The MIS photodetector 220 of photosensor pixel 200 includes a semiconductor layer 224, an insulator layer 225, and a transparent conductor layer 226 stacked successively on one another. A lower electrode 222 is on the substrate below the MIS photodetector 220. The lower electrode 222 may include a conductive material such as, for example, a metal, Mo, Ti, ITO, IZO, Al, Au, or the like. A carrier barrier layer 223 is on the lower electrode 222 and connects the semiconductor layer 224 of the MIS photodetector 220 to the lower electrode 222 through an ohmic contact. The carrier barrier layer 223 may be an n+ doped film that prevents the injection of holes into the semiconductor layer 224. The carrier barrier layer 223 may include a material such as, for example, a-Si, poly-silicon, doped metal oxide semiconductors or the like.

The semiconductor layer 224 includes a photosensitive semiconductor such as, for example, a-Si, poly-silicon, metal oxide semiconductors, or the like. The wavelength of radiation detected by the MIS photodetector 220 may depend on the material of the photosensitive semiconductor. For example, the MIS photodetector may detect ultraviolet, visible, and/or infrared radiation.

The insulator layer 225 may include, for example, a-Si nitride, silicon nitride, or the like. The transparent conductor layer 226 may include a transparent or semi-transparent conductive material such as, for example, ITO, IZO, or the like. The transparent conductor layer 226 forms the metal electrode of the MIS photodetector, and includes a transparent conductive material so that light can pass through to reach the photosensitive semiconductor layer 224.

In the photosensor pixel 200, an upper insulator layer 227 is on the transparent conductor layer 226 of the MIS photodetector 220. The upper insulator layer 227 may include, for example, a-Si nitride, silicon nitride, or the like. An upper electrode 228 provides a connection to the transparent conductor layer 226 through a hole (via) in the upper insulator layer 227. The upper electrode 228 may include a conductive material such as, for example, a metal, Mo, Ti, Al, or the like.

The lower electrode 222 below the MIS photodetector extends over to the TFT 210 and serves as the source electrode 212 of the TFT 210. Accordingly, the lower electrode 222 electrically connects the source electrode 212 of the TFT 210 to the semiconductor layer 224 of the MIS photodetector 220 via the n+ carrier barrier layer 223.

Although specific layers of the photosensor pixel 200 are described with reference to FIG. 2, one skilled in the art would recognize that additional layers may be included above, below, or between some or all of the layers described above.

Notably, the layers of both the TFT readout switch 210 and MIS photodetector 220 are inverted compared to the TFT 110 and MIS photodetector 120 of photosensor pixel 100. The architecture of photosensor pixel 200 may provide various performance advantages over the architecture of photosensor pixel 100 depicted in FIG. 1. For example, as described in greater detail below, during photon integration, the photosensor pixel 200 is biased so that electrons are swept to the lower electrode 222 as electron-hole pairs are generated in the semiconductor layer 224. The signal produced by the electrons at the lower electrode 222 represents the output signal of the photosensor pixel 200. Connecting the semiconductor layer 224 of the MIS photodetector 220 to the source electrode 212 of the TFT 210 therefore allows for direct charge readout.

By contrast, in the configuration of photosensor pixel 100 depicted in FIG. 1, the TFT 110 is insulated from the semiconductor layer 124 by the insulator layer 125. As described above, the output signal in photosensor pixel 100 is an induced charge at the lower electrode 126 of the MIS photodetector 120 resulting from holes that are accumulated at the insulator/semiconductor interface. The conversion of holes into an induced charge is not as efficient as the collection of electrons at the lower electrode 222 directly from the semiconductor layer 224 of photosensor pixel 200. Accordingly, readout of direct charge in photosensor pixel 200 provides better sensitivity than readout of the charge induced in the upper electrode 228.

The configuration of photosensor pixel 200 may also provide greater sensitivity due to increased absorption of incident radiation at the insulator/semiconductor interface. Maximum absorption in a semiconductor layer occurs at the side of the semiconductor layer on which radiation is incident. In MIS photodetector 220, when radiation (e.g., ultraviolet, visible, or infrared radiation) 230 is incident upon the transparent conductor layer-side of the MIS photodetector (i.e., the side adjacent to transparent conductor layer 226), maximum absorption occurs in the semiconductor layer 224 at the interface with the insulator layer 225. Furthermore, the semiconductor layer 224 has maximum hole storage efficiency at the insulator/semiconductor interface because generated holes, which travel through the semiconductor material much more slowly than electrons, do not need to travel across the semiconductor layer 224 where they can be recombined and lost by opposite electrons. Absorption near the insulator/semiconductor interface creates electron-hole pairs where the holes are collected and most efficiently stored. Therefore, the photosensor pixel 220 allows for minimum slow hole transport and increased efficiency. By contrast, in photosensor pixel 100, since radiation is incident on the semiconductor layer-side of MIS photodetector 120, maximum absorption occurs in the semiconductor layer 124 at the n+/semiconductor interface on the side opposite the insulator layer 125.

In addition, the architecture of photosensor pixel 200 allows the insulator layer 225 of the MIS photodetector and the gate insulator layer 217 of the TFT to have different thicknesses, despite the TFT and MIS sharing the same n+ and semiconductor layers. The thickness of the insulator layer 225 determines the capacitance of the MIS photodetector, which makes it possible to optimize the MIS photodetector independent of the thickness of the gate insulator of the TFT. The configuration of photosensor pixel 200 allows the upper insulator layer 227 above the transparent conductor layer 226 of the MIS photodetector to be formed separately from the insulator layer 225. As seen in FIG. 2, the upper insulator layer 227 extends over to the TFT 210 where it serves as the gate insulator layer 217. The thicknesses of the gate insulator layer 217 and the insulator layer 225 may therefore be chosen separately in order to optimize the performance of the TFT and the MIS photodetector, respectively. In addition, it is generally preferable that the insulator of the TFT 210 between the semiconductor layer 219 and the gate electrode 218 be thicker than the insulator layer 225 of the MIS photodetector. Thus, the presence of the dielectric layer 216 in the TFT, which may also serve as the insulator layer 225 of the MIS photodetector, does not prevent optimization of the TFT 210.

Figure 3A:
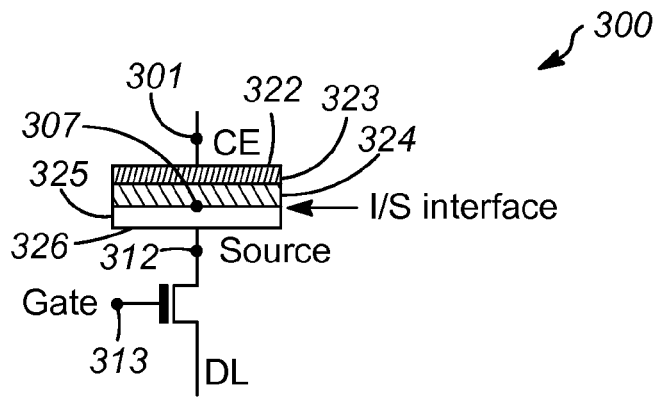
FIG. 3A depicts a circuit representation of a prior art photosensor pixel.
Figure 3B:
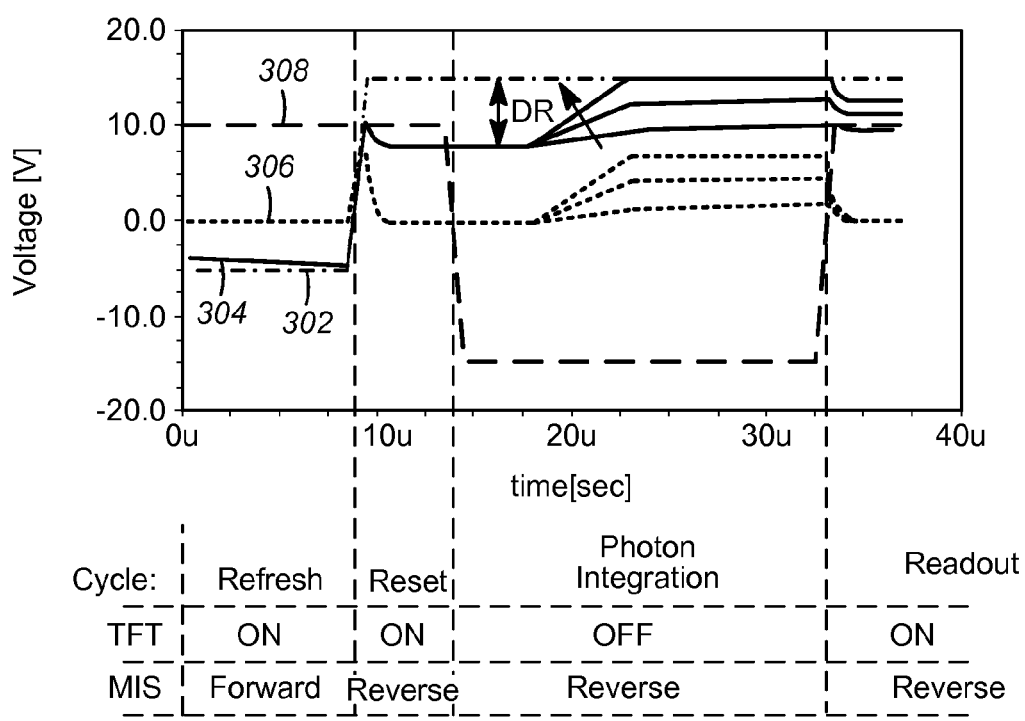
FIG. 3B depicts a plot of voltages in the prior art photosensor pixel during operation.

Turning to FIGS. 3A-3B, a photosensor pixel 300 and the signals at various positions of the photosensor pixel 300 during operation are described. FIG. 3A depicts a schematic representation of photosensor pixel 300, which is configured according to the architecture of photosensor pixel 100 shown in FIG. 1 (prior art). As shown in FIG. 3A, the lower electrode 326 of the MIS photodetector is connected to a source electrode 312 of the TFT. The photosensor pixel 300 is controlled by a voltage source at terminal CE 301, which is connected to the upper electrode 322 of the MIS photodetector, and by a voltage source connected to the gate 313 of the TFT.

FIG. 3B illustrates the voltage at various positions of the photosensor pixel 300 during operation. The horizontal axis represents time and the vertical axis represents voltage. Line 308 represents the voltage at the gate electrode 313, line 306 represents the voltage at the source electrode 312 of the TFT, line 304 represents the voltage at the insulator/semiconductor interface 307, and line 302 represents the voltage at upper electrode 322.

Operation of the photosensor pixel 300 includes a refresh operation followed by a reset operation, photon integration, and readout. The refresh operation prepares the MIS photodetector for photon integration and attempts to eliminate holes accumulated at the interface 307 between the semiconductor layer 324 and insulator layer 325 during photon integration (discussed in greater detail below). To refresh the MIS photodetector, the TFT is turned on and the MIS photodetector is forward biased. The TFT is turned on by applying a positive potential +10V to the gate 313 of the TFT. The MIS photodetector is forward biased by applying a negative potential to the upper electrode 322 relative to the source electrode 312. In the illustrated example, the MIS photodetector is forward biased by applying a voltage of −5V to the terminal CE 301 relative to the source electrode 312. Since the TFT is on, the forward bias draws electrons into the semiconductor layer 324 to recombine with holes and clears any previous stored image/photo charge. As seen in FIG. 3B, the voltage at the insulator/semiconductor interface 307 (line 304) follows the voltage at terminal CE 301 (line 302), and also reaches a voltage of approximately −5V.

Next, the photosensor pixel 300 is reset to further prepare the MIS photodetector for photon integration. The MIS photodetector is reset by leaving the TFT on and reversing the bias on the MIS photodetector. The TFT is kept on by maintaining the voltage at the gate electrode 313 at +10V. The bias on the MIS photodetector is reversed by applying +15V to the terminal CE 301. This clears out excess electrons that were injected into the semiconductor layer 324 during the refresh operation through the upper electrode 322, while holes are blocked from entering the semiconductor layer 324 by the carrier barrier layer 323. As seen in FIG. 3B, the voltage at the insulator/semiconductor interface 307 (line 304) follows the voltage of the terminal CE 301 (line 302) and increases to around +7.5V. Notably, the voltage at the source electrode 312 (line 306) in the reset state represents the noise floor of the sensor.

After the photosensor pixel 300 is reset, it is set to a photon integration mode to collect photons. During photon integration, the TFT is turned off by applying a −15V to the gate 313 of the TFT, and the MIS photodetector remains reverse biased. Photons incident on the top of the photosensor pixel 300 pass through the carrier barrier layer 323 and are absorbed in the semiconductor layer 324. When photons are absorbed in the semiconductor layer 324, electron-hole pairs are created. Due to the positive potential at the upper electrode 322, the holes are pushed to the interface between the semiconductor layer 324 and the insulator layer 325 (i.e., the insulator/semiconductor interface 307), but do not move into the insulator layer 325. As shown by line 304, the voltage at the insulator/semiconductor interface 307 increases due to the positive charge accumulating at the insulator/semiconductor interface 307. This induces a charge on the lower electrode 326, which causes the voltage at the source electrode 312 (line 306) to increase. The induced charge is proportional to the number of electron-hole pairs generated in the semiconductor layer 324 by the absorbed photons. Accordingly, the charge induced at the source electrode 312 is proportional to the amount of incident radiation.

FIG. 3B shows the voltages at the insulator/semiconductor interface 307 and source electrode 312 for three different levels of incident illumination. The different voltages resulting from the variation in illumination are illustrated by the separation of lines 304 and 306 during photon integration. Each line represents the voltage resulting from a different level of incident illumination, with an arrow indicating the direction of increasing illumination. Greater illumination results in increased photon absorption, and thus a larger voltage.

Notably, the voltage at the insulator/semiconductor interface 307 (line 304) can only rise as high as the terminal voltage CE 301 (line 302). Thus, photosensor pixel 300 reaches saturation when the voltage at the insulator/semiconductor interface 307 (line 304) reaches +15V. Since the voltage at the source 312 (line 306) follows the voltage at the insulator/semiconductor interface 307, the starting voltage at the insulator/semiconductor interface 307 and the voltage at terminal CE 301 limits the possible change in voltage at the source electrode 312. Thus, the dynamic range (DR) is limited by the voltage at the insulator/semiconductor interface 307 at the start of photon integration and the terminal voltage CE 301.

Following photon integration, the readout cycle begins by turning on the TFT to read the induced charge at the source electrode 312. Once the induced charge is read, the source electrode 312 returns to 0V and the voltage at the insulator/semiconductor interface 307 is reduced.

Figure 4A:
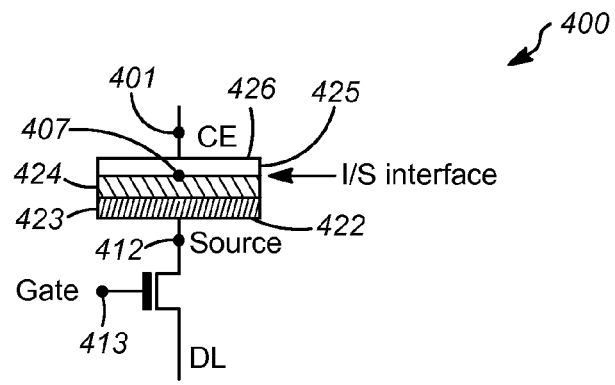
FIG. 4A depicts a circuit representation of an exemplary improved photosensor pixel with an MIS photodetector and TFT readout switch.
Figure 4B:
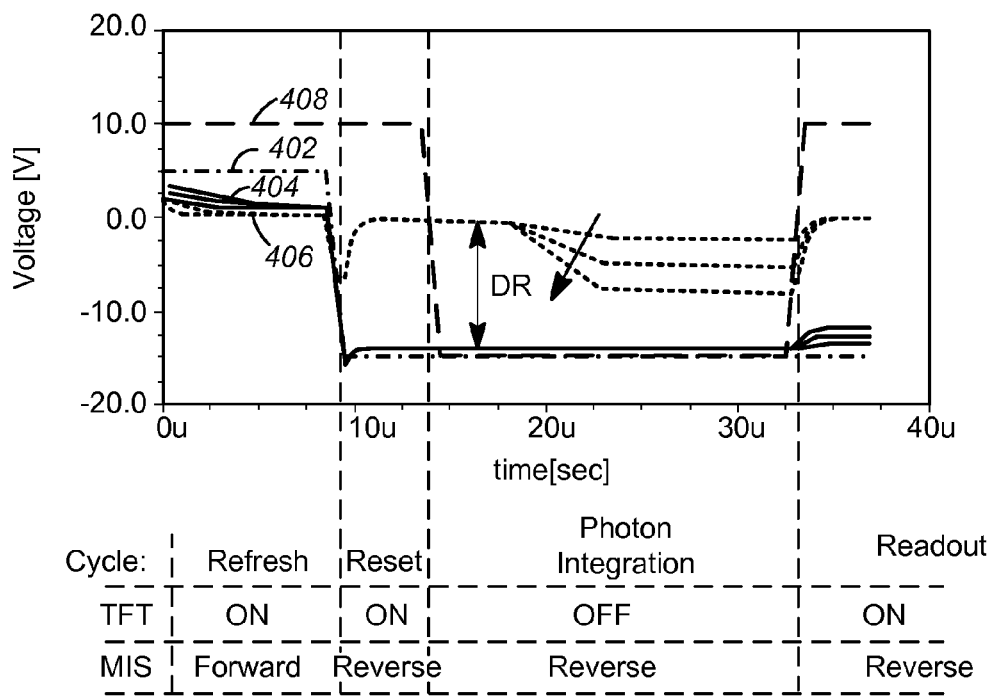
FIG. 4B depicts a plot of voltages in the improved photosensor pixel during operation.

Turning to FIGS. 4A and 4B, the signals at various positions of the photosensor pixel 400 shown in FIG. 4A are described. FIG. 4A depicts a schematic representation of the photosensor pixel 400, which has a similar architecture to photosensor pixel 200 depicted in FIG. 2. As shown in FIG. 4A, the lower electrode 422 connects the semiconductor layer 424 to the source electrode 412 of the TFT via the carrier barrier layer 423. The pixel is controlled by a voltage source at terminal CE 401, which is connected to the transparent conductor layer 425 of the MIS photodetector and by a voltage source connected to the gate electrode 413 of the TFT.

FIG. 4B illustrates the voltage at various positions of pixel 400 during operation. The horizontal axis represents time and the vertical axis represents voltage. Line 408 represents the voltage at the gate electrode 413, line 406 represents the voltage at the source electrode 412 of the TFT, line 404 represents the voltage at the insulator/semiconductor interface 407, and line 402 represents the voltage at the transparent conductor layer 426.

During the refresh cycle, the TFT of photosensor pixel 400 is turned on by applying a positive potential to the gate 413 of the TFT, and the MIS photodetector is forward biased. Since the layers of the MIS photodetector in photosensor pixel 400 are connected in the reverse order relative to the MIS photodetector in photosensor pixel 300 shown in FIG. 3A, the MIS photodetector is forward biased when the source electrode 412 has a negative potential relative to the transparent conductor layer 426. In the example illustrated in FIG. 4A, the photosensor pixel 400 is forward biased by applying +5V to the transparent conductor layer 426 via terminal CE 401. Notably, unlike the photosensor pixel 300 in FIG. 3A, the voltage at the insulator/semiconductor interface 407 (line 404) does not follow the potential at the terminal CE 401 (line 402).

In the reset cycle, the TFT remains on by keeping +10V applied to gate 413, and the bias on the MIS photodetector is reversed by applying −15V to the terminal CE 401 (line 402). Here, the voltage at the insulator/semiconductor interface 407 (line 404) follows the voltage at the terminal CE 401 and settles around −15V. Notably, the reset voltage at the source terminal 412 (line 406) represents the noise floor of the photosensor pixel.

In the photon integration mode, the TFT is turned off by applying a voltage of −15V to the gate 413 of the TFT (line 408). The MIS photodetector remains reverse biased during photon integration. As photons incident on the semiconductor layer 424 produce electron-hole pairs, the negative potential CE 401 attracts holes and keeps the voltage at the insulator/semiconductor interface 407 steady (line 404). In addition, the voltage at the source electrode 412 (line 406) drops due to the collection of electrons being swept out of the semiconductor layer 424 and stored on the lower electrode 422.

FIG. 4B shows the voltage at the source electrode 412 for three different levels of incident illumination. The different voltages resulting from the variation in illumination are illustrated by the separation of line 406 during photon integration. Each line represents the voltage resulting from a different level of incident illumination, with an arrow indicating the direction of increasing illumination. Greater illumination results in increased photon absorption, and thus a larger negative voltage.

Although not shown in the example illustrated in FIG. 4B, the voltage at the source electrode 412 can drop as low as the voltage at terminal CE 401 (−15V), at which point the photosensor pixel 400 is saturated. The difference between the voltage of the source electrode 412 at the beginning of photon integration and the saturation voltage represents the dynamic range of the pixel. Notably, unlike photosensor pixel 300 in FIG. 3A, the change in source voltage 406 is not limited by the initial voltage at the insulator/semiconductor interface 407 (line 404), and therefore can have a larger range.

Following photon integration, the readout cycle begins by turning on the TFT (applying +10V to gate electrode 413), which sends the stored charge on the lower electrode 422 outside of pixel 400 for integration and digitization. As the stored charge is transferred out of the pixel, the voltage at the source electrode 412 (line 406) returns to 0V.

Figure 5:
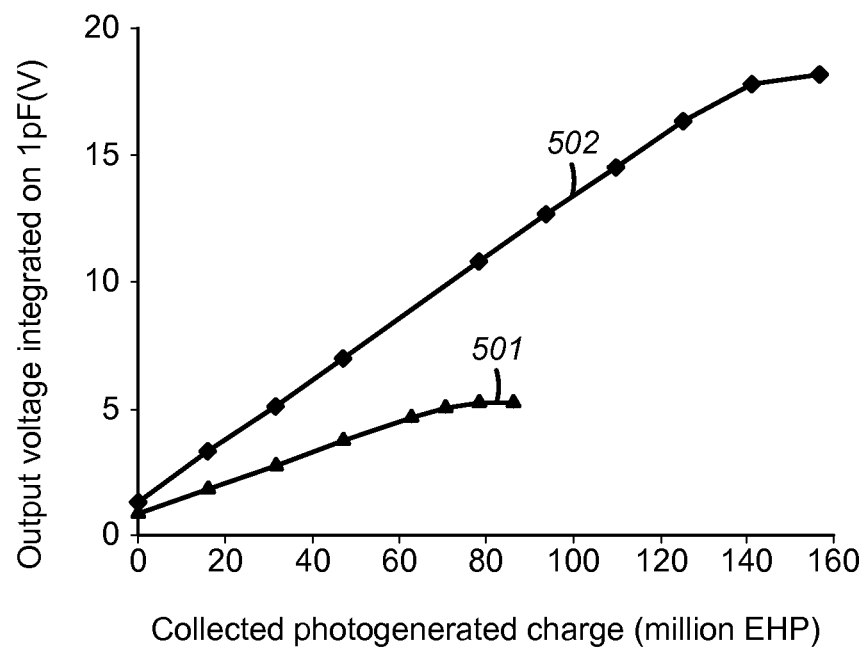
FIG. 5 depicts a plot of the output voltage of two photosensor pixels.

FIG. 5 is a plot illustrating the sensitivity of an exemplary photosensor pixel having the architecture of photosensor pixel 200 depicted in FIG. 2 compared to the sensitivity of a photosensor pixel having the architecture of photo sensor pixel 100 depicted in FIG. 1. The horizontal axis represents the collected photogenerated charge (i.e., the amount of charge collected by the detector due to photons incident on the detector) in units of one million electron-hole pairs (MEHP). The vertical axis represents the output voltage integrated by an external charge integrator with a 1 picofarad (pF) feedback capacitor.

Line 501 represents the normalized output voltage of a photosensor pixel configured according to photosensor pixel 100 having an MIS photodetector capacitance of 0.74 pF. The insulator layer of the MIS photodetector comprises nitride and has a thickness of 250 nm. Line 502 represents the normalized output voltage of a photosensor pixel configured according to photosensor pixel 200 having an MIS photodetector capacitance of 1.7 pF. The insulator layer of the MIS photodetector comprises nitride and has a thickness of 50 nm. The change in output voltage per unit change in collected photogenerated charge (i.e., the slope of each line) represents the sensitivity of the device. The point at which the output voltage stops increasing as more electron-hole pairs are produced represents the saturation point of the detector. The output voltage generated when zero charge is collected represents the inherent noise in the device (i.e., the noise floor). The ratio of the maximum output signal at saturation to the noise floor represents the dynamic range of the system.

As seen in FIG. 5, the device with a configuration according to photosensor pixel 100 has a sensitivity of approximately 0.067 V/MEHP. The noise floor is approximately 0.75 V, and the maximum output voltage is approximately 5V. Accordingly, the dynamic range is approximately 70 MEHPs.

By contrast, the device with a configuration according to photosensor pixel 200 has a sensitivity of about 0.12 V/MEHP. The noise floor is approximately 1 V, and the maximum output voltage is approximately 18 V. Accordingly, the dynamic range is approximately 140 MEHPs. Thus, the architecture of photosensor pixel 200 provides almost twice as much sensitivity and dynamic range as the architecture of photosensor pixel 100.

Computer simulations also indicate that the architecture of photosensor pixel 200 may result in greater charge collection efficiency (i.e., the fraction of collected electron-hole pairs versus absorbed photons). For example, simulations were performed to compare the performance of photosensor pixel 200 having a 110 nm a-Si semiconductor layer and a 50 nm n+ layer to photosensor pixel 100 having a 100 nm n+ layer and a 500 nm a-Si semiconductor layer. For a given amount of radiation, the simulated photosensor pixel 200 collected over 50 percent more charge than the photosensor pixel 100.

Figure 6:
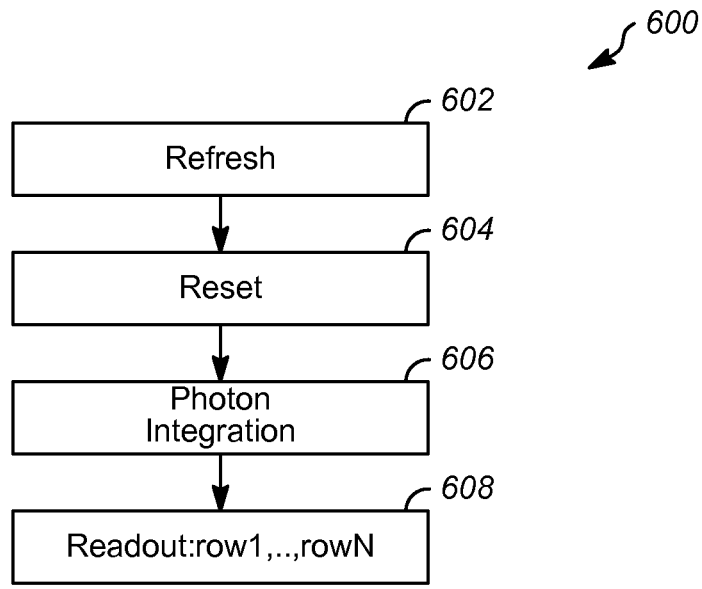
FIG. 6 depicts a diagram of an exemplary process of operating a photosensor pixel array for static imaging.

Turning now to FIG. 6, an exemplary process 600 for operating an array of photosensor pixels is described. The array may include photosensor pixels 200 or 400 discussed above (FIGS. 2 and 4A). Process 600 may be used to capture a single static image, or may be repeated to capture a sequence of images.

In step 602, the array is refreshed to clear the photosensor pixels of any previously stored image or photo charge and prepare the MIS photodetectors for photon integration. The photosensor pixels may be refreshed as described above with reference to FIGS. 4A-4B (i.e., the TFTs are turned on and the MIS photodetectors are forward biased by applying a positive voltage to the transparent conductor layer (e.g., 226 or 426) relative to the lower electrode (e.g., 222 or 422)).

In step 604, the photosensor pixels are reset to further prepare the MIS photodetector for photon integration. The photosensor pixels may be reset as described above with reference to FIGS. 4A-4B (i.e., the TFT is left on and the MIS photodetector is reverse biased by applying a negative potential to the transparent conductor layer (e.g., 226 or 326)).

In step 606, the array is set to an integration mode to collect photons. As described above, during the integration cycle, the TFTs are turned off and the MIS photodetectors remain reverse biased. Photons incident on the top of the photosensor pixel pass through the transparent conductor layer (e.g., 226 or 426) and the insulator layer (e.g., 225 or 425) and are absorbed in the semiconductor layer (e.g., 224 or 424). A charge is accumulated on the lower electrodes (e.g., 222 or 422) proportional to the amount of incident photons.

In step 608, the signal value of each photosensor pixel is read out. The accumulated charge on the lower electrodes (e.g., 222 or 422) of the photosensor pixels in a row are read out by turning on the TFTs of the photosensor pixels in that row, while the MIS photodetectors remain reverse biased. Each row may be read out consecutively to capture the signal values for the entire array.

Figure 7:
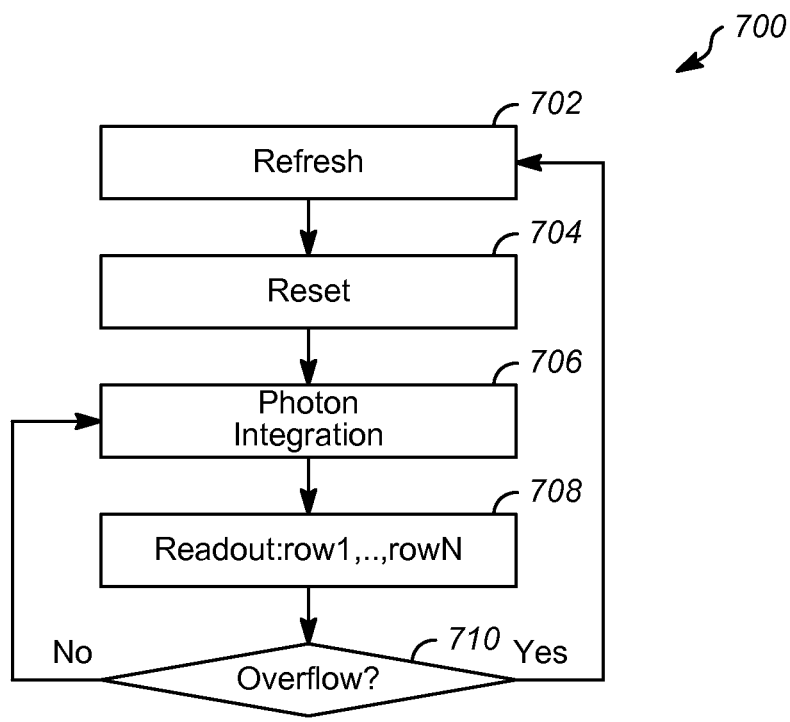
FIG. 7 depicts a diagram of an exemplary process of operating a photosensor pixel array for dynamic imaging.

FIG. 7 depicts another exemplary process 700 for operating an array of photosensor pixels (e.g., 200 or 400). In steps 702, 704, 706, and 708, the refresh, reset, photon integration, and readout operations may be performed as described above for process 600.

In step 710, a determination is made whether the pixels in any of the rows are saturated, i.e., whether the pixels have achieved their voltage limit and can no longer respond to additional incident photons. If the pixels are saturated, process 700 returns to step 702 to refresh and reset the pixels so that more photons can be collected. If, however, the pixels are not saturated and are capable of responding to additional incident photons, then the process returns to the photon integration 706 step without refreshing or resetting the photosensor pixels. Since the pixels are not refreshed and reset, the signal at the next readout operation 708 represents the amount of photons collected during both the previous frame and the current frame. Thus, the signal value of the pixel due to radiation incident during the second integration period is the current signal value minus the previous signal value. Process 700 may allow images to be captured more rapidly (i.e., at a higher frame rates or with a shorter frame times), since the refresh step 702 and reset step 704 are not necessarily performed after every readout step 708.

The ability to capture images quickly is especially important in imaging applications using very large arrays. Refreshing and resetting the pixels increases the amount of time between captured images, which reduces the number of frame images that can be captured per second (i.e., reduced frame rate or increased frame time). Bypassing the refresh and reset operations may allow for shorter frame times, which are especially desirable for live imaging or reducing the total imaging time in certain imaging modalities that require multiple frames such as tomosynthesis or computed tomography.

Although the steps in processes 600 and 700 are described in a particular order, one skilled in the art would recognize that additional steps may be performed before, after, or in between some or all of the step described above.

Turning to FIG. 8, an exemplary process 800 for forming a photosensor pixel (e.g., 200 or 400) is described.

First, a bottom conductive layer 804 is formed on a substrate 802. For example, a metal such as aluminum may be sputtered onto the substrate. The bottom conductive layer 804 may include, for example, Mo, Ti, ITO, IZO, Al, or the like. The bottom conductive layer 804 acts as the source and drain electrodes of the TFT. It also serves as the lower electrode of the MIS photodetector to connect the MIS photodetector to the source electrode of the TFT.

Next, a heavily doped n-type semiconductor (n+) layer 806 is formed on the bottom conductive layer 804 by, for example, plasma-enhanced chemical vapor deposition (PECVD) or sputtering. Applying the n+ layer 806 to the bottom conductive layer 804 results in the structure shown in FIG. 8A. The n+ layer 806 may include a material such as, for example, n+ doped a-Si, poly-silicon, indium gallium zinc oxide (IGZO), or the like. The n+ layer 806 acts as the carrier barrier layer of the MIS photodetector and the ohmic contact layer for the drain and source electrodes of the TFT.

Figure 8A:
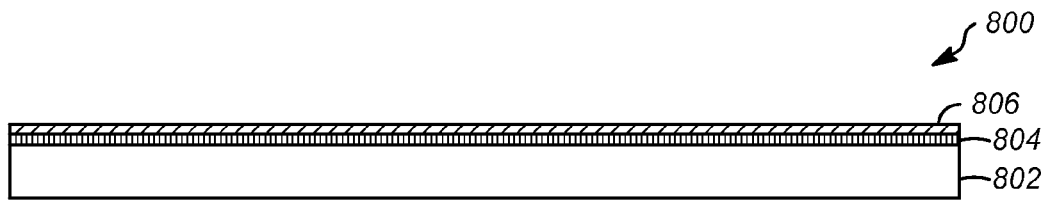
FIGS. 8A-8H depict layers of a photosensor pixel during a fabrication process.
Figure 8B:
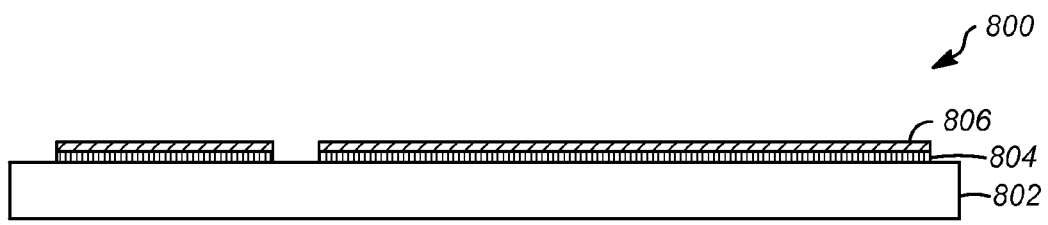

Next, the n+ layer 806 is patterned with a first mask, and the n+ and bottom conductive layers 806, 804 are etched as shown in FIG. 8B, exposing portions of the substrate 802. In particular, this etching step forms a gap in the bottom conductive layer 804 that separates the source electrode from the drain electrode of the TFT and defines the channel region of the TFT.

Next, a semiconductor layer 808 is produced by, for example, PECVD or sputtering. The semiconductor layer 808 includes a photosensitive semiconductor such as, for example, a-Si, poly-silicon, IGZO, or the like. The semiconductor layer serves as the photoelectric conversion layer of the MIS photodetector and the semiconductor layer of the TFT.

Next, a dielectric layer 810 is deposited on the semiconductor layer 808 by, for example, PECVD or sputtering. The dielectric layer 810 may include, for example, a-Si nitride, silicon nitride, silicon dioxide, titanium oxide, or the like. The dielectric layer 810 serves as the insulator layer in the MIS photodetector and as a portion of the gate insulating film of the TFT.

Figure 8C:
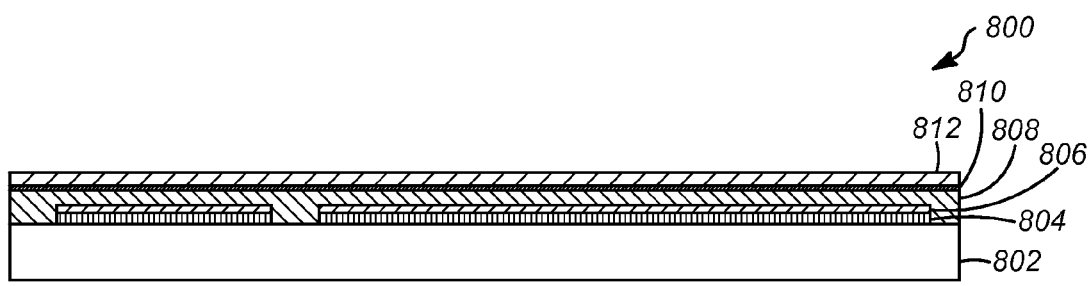

Next, the transparent conductor layer 812 is sputtered onto the dielectric layer 810 to produce the structure depicted in FIG. 8C. The transparent conductor layer 812 may include ITO, IZO, or the like. This layer acts as the transparent conductor layer in the MIS photodetector.

Figure 8D:
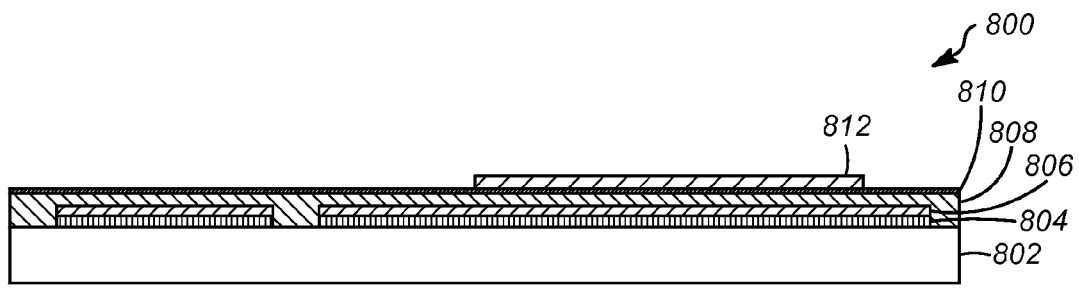

Next, the transparent conductor layer 812 is patterned with a second mask and is etched to produce the structure shown in FIG. 8D. In exemplary process 800, the entire transparent conductor layer 812 is removed except for the portion used for the MIS photodetector.

Figure 8E:
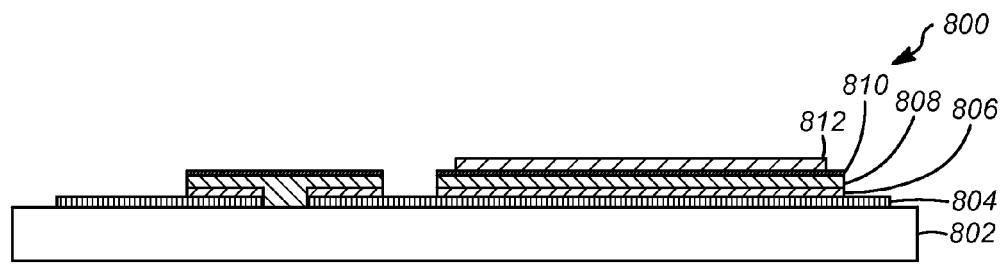

Next, the dielectric layer 810 is patterned with a third mask, and the dielectric and semiconductor layers 810, 808 are etched to produce the structure shown in FIG. 8E. In particular, the dielectric and semiconductor layers 810, 808 are etched to form semiconductor islands that define the semiconductor portions of the TFT and MIS photodetector.

Next, an insulator layer 814 is formed by, for example, PECVD or sputtering. The insulator layer 814 may include, for example, silicon nitride, silicon dioxide, or the like. The insulator layer 814 acts primarily as the gate insulator layer of the TFT.

Figure 8F:
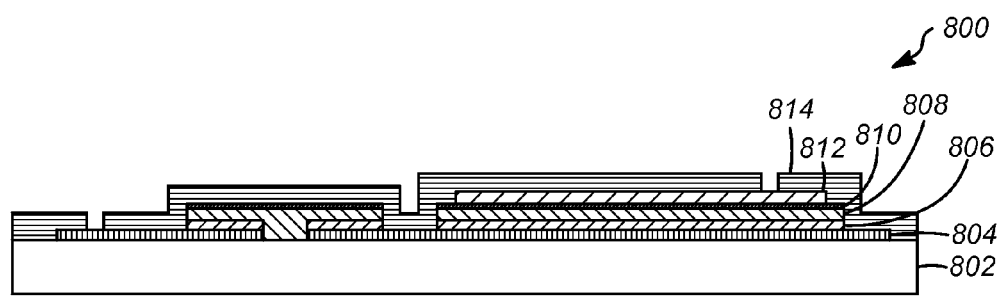

Next, the insulator layer 814 is patterned with a fourth mask and etched to form vias exposing the transparent conductor layer 812 above the MIS photodetector and the bottom conductive layer 804 near the drain of the TFT, as shown in FIG. 8F.

Next, an upper conductive layer 816 is formed by, for example, sputtering or evaporation. The upper conductive layer 816 may include a conductive material such as, for example, a metal, Mo, Ti Al, or the like. The upper conductive layer 814 acts as the gate of the TFT and provides an electrical contact to the transparent conductor layer 812 of the MIS photodetector and the drain of the TFT.

Figure 8G:
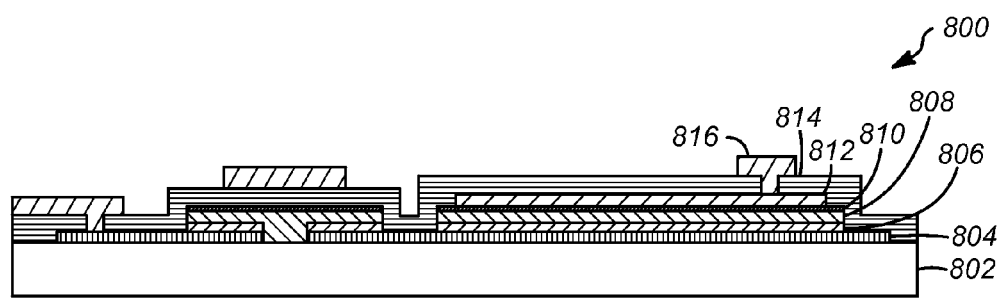

Next, the upper conductive layer 816 is patterned with a fifth mask and is etched to form the gate of the TFT and the contact electrodes for the drain of the TFT and the transparent conductor layer of the MIS photodetector, as depicted in FIG. 8G. An advantageous feature of this process is that the gate electrode of the TFT also acts as the light block of the TFT, and therefore, eliminates the need for deposition and patterning of an extra layer for blocking the light from reaching the channel area of the TFT.

Figure 8H:
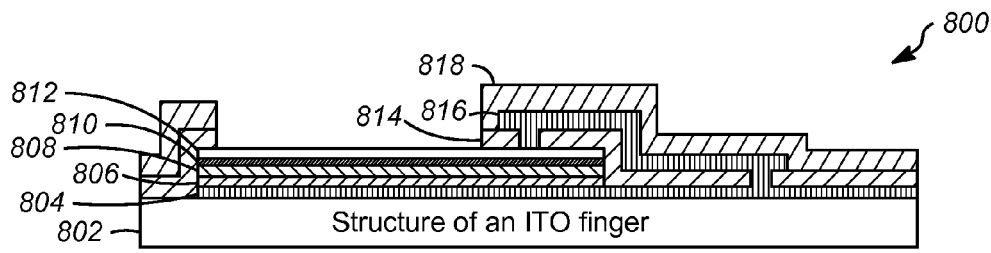

The fabrication process for the TFT-MIS pixel photosensor array may also include steps for encapsulation and protecting the structures from corrosion. A protective dielectric layer 818 may be applied by, for example, PECVD or sputtering. The protective layer 818 may include an insulator, for example, a-Si nitride, silicon nitride, or the like. In some embodiments, the protective layer covers the entire pixel array and all upper metal layers, and is patterned with a sixth mask only at external electrical contact pads to produce the structure depicted in FIG. 8H. As seen in FIG. 8H, the insulator and protective layers 814, 818 are removed from the contact area to expose the transparent conductor which has better corrosion resistance.

The fabrication process 800 described above has several advantages. For example, the TFT and MIS photodetector can be formed in the same process with several of the layers acting as portions of both the TFT and the MIS photodetector, while allowing critical layers such as the MIS insulator and TFT gate insulator to be optimized independently, and eliminating the need for a separate light block for the TFT.

Process 800 may allow the thickness of the gate insulator layer of the TFT to be different than the thickness of the insulator layer of the MIS photodetector. In general, it is preferable that the insulator layer of the MIS photodetector be as thin as possible to maximize the capacitance of the detector, but not so thin as to produce undesirable tunneling effects. In the MIS photodetector, the insulator layer stops the passage of both electrons and holes. It requires a sufficient thickness not to give rise to a tunnel effect, and is usually formed to a thickness in the order of approximately 50 nm. However, for optimum performance, the gate insulator layer of the TFT should be thicker, in the order of 250 nm.

In the device produced by process 800, the dielectric layer 810 acts as the insulator layer of the MIS, and the insulator layer 814 acts as the gate insulator layer of the TFT. The thickness of each of these layers can be determined separately to optimize the individual performance of both the MIS photodetector and the TFT, and to improve the performance of the photosensor pixel overall. For example, the sensitivity and dynamic range may be improved by separately optimizing the MIS photodetector and the TFT.

The foregoing descriptions of specific embodiments have been presented for purposes of illustration and description. They are not intended to be exhaustive or to limit the scope of the claims to the precise forms disclosed, and it should be understood that many modifications and variations are possible in light of the above teaching.

I claim:
1. A photosensor pixel comprising:
    a thin film transistor (TFT), the TFT comprising:
        a gate;
        a gate insulator layer;
        a semiconductor layer forming a channel region;

a drain; and
a source; and
a metal-insulator-semiconductor (MIS) photodetector, the MIS photodetector comprising:
a transparent conductor layer;
a semiconductor layer including a photosensitive semiconductor; and
an insulator layer between the transparent conductor layer and the semiconductor layer,
wherein
the semiconductor layer of the MIS photodetector is electrically connected to the source or the drain of the TFT, and
the thickness of the insulator layer of the MIS photodetector is less than the thickness of the gate insulator layer of the TFT.

2. The photosensor pixel of claim 1, further comprising:
a substrate, wherein the TFT and the MIS photodetector are on the substrate, and the semiconductor layer of the MIS photodetector is between the substrate and the insulator layer of the MIS photodetector.

3. The photosensor pixel of claim 2, wherein the semiconductor layer of the TFT is between the substrate and the gate insulator layer of the TFT.

4. The photosensor pixel of claim 1, wherein the semiconductor layer of the TFT and the semiconductor layer of the MIS comprise amorphous silicon (a-Si), poly silicon, or amorphous indium gallium zinc oxide alloy.

5. A photo-imaging device comprising a plurality of photosensor pixels according to claim 1.

6. A radiation imaging device comprising:
a photo-imaging device according to claim 5; and
a scintillation material optically coupled to the photo-imaging device and configured to convert incident radiation to photons, wherein the energy of the radiation is greater than the energy of the photons.

* * * * *